(12) United States Patent
Sithanandam et al.

(10) Patent No.: US 10,944,257 B2
(45) Date of Patent: Mar. 9, 2021

(54) INTEGRATED SILICON CONTROLLED RECTIFIER (SCR) AND A LOW LEAKAGE SCR SUPPLY CLAMP FOR ELECTROSTATIC DISCHARGE (ESP) PROTECTION

(71) Applicants: STMicroelectronics International N.V., Schiphol (NL); STMicroelectronics SA, Montrouge (FR)

(72) Inventors: Radhakrishnan Sithanandam, Greater Noida (IN); Divya Agarwal, Noida (IN); Jean Jimenez, Saint Theoffrey (FR); Malathi Kar, Delhi (IN)

(73) Assignees: STMicroelectronics International N.V., Schiphol (NL); STMicroelectronics SA, Montrouge (FR)

( * ) Notice: Subject to any disclaimer, the term of this patent is extended or adjusted under 35 U.S.C. 154(b) by 298 days.

(21) Appl. No.: 15/952,466

(22) Filed: Apr. 13, 2018

(65) Prior Publication Data
US 2019/0319454 A1    Oct. 17, 2019

(51) Int. Cl.
*H02H 9/02* (2006.01)
*H02H 9/04* (2006.01)
(Continued)

(52) U.S. Cl.
CPC ......... *H02H 9/046* (2013.01); *H01L 27/0255* (2013.01); *H01L 27/0262* (2013.01);
(Continued)

(58) Field of Classification Search
CPC .......... H02H 9/02; H02H 9/045; H02H 9/046; H01L 27/0255; H01L 27/0259;
(Continued)

(56) References Cited

U.S. PATENT DOCUMENTS 5,400,202 A * 3/1995 Metz ................... H01L 27/0251
361/111
5,452,171 A * 9/1995 Metz ................... H01L 27/0251
361/118
(Continued)

FOREIGN PATENT DOCUMENTS

JP        2011176091 A        9/2011

OTHER PUBLICATIONS

Chiu, Po-Yen et al: "Design of Low-Leakage Power-Rail ESD Clamp Circuit With MOM Capacitor and STSCR in a 65-nm CMOS Process," 2011 ICICIDT Conference, 4 pages.
(Continued)

*Primary Examiner* — Adolf D Berhane
(74) *Attorney, Agent, or Firm* — Crowe & Dunlevy

(57) ABSTRACT

Electrostatic discharge (ESD) protection is provided in using a supply clamp circuit using an ESD event actuated SCR device. The SCR device may include an embedded field effect transistor (FET) having an insulated gate that receives a trigger signal from an ESD detection circuit. The SCR device may alternatively include a variable substrate resistor having an insulated gate that receives a trigger signal from an ESD detection circuit.

46 Claims, 7 Drawing Sheets

(51) Int. Cl.
*H01L 27/02* (2006.01)
*H01L 27/07* (2006.01)
*H01L 29/06* (2006.01)

(52) U.S. Cl.
CPC ...... *H01L 27/0266* (2013.01); *H01L 27/0722* (2013.01); *H01L 29/0649* (2013.01)

(58) Field of Classification Search
CPC ............. H01L 27/0262; H01L 27/0266; H01L 27/0722; H01L 29/0649
See application file for complete search history.

(56) References Cited

U.S. PATENT DOCUMENTS

| | | | |
|---|---|---|---|
| 5,528,188 A * | 6/1996 | Au | H01L 27/0259 |
| | | | 327/310 |
| 6,208,494 B1 | 3/2001 | Nakura et al. | |
| 6,919,602 B2 | 7/2005 | Lin et al. | |
| 7,245,468 B2 | 7/2007 | Griesbach et al. | |
| 7,589,945 B2 | 9/2009 | Miller et al. | |
| 8,129,788 B1 * | 3/2012 | Walker | H01L 27/0262 |
| | | | 257/355 |
| 8,759,871 B2 | 6/2014 | Song et al. | |
| 9,401,351 B2 * | 7/2016 | Jimenez | H01L 27/1027 |
| 2002/0064007 A1 | 5/2002 | Chang et al. | |
| 2005/0151160 A1 * | 7/2005 | Salcedo | H01L 27/0262 |
| | | | 257/173 |
| 2007/0247772 A1 * | 10/2007 | Keppens | H01L 27/0266 |
| | | | 361/56 |
| 2008/0049365 A1 | 2/2008 | Worley et al. | |
| 2010/0090283 A1 | 4/2010 | Langguth et al. | |
| 2010/0165523 A1 | 7/2010 | Son | |
| 2012/0120531 A1 * | 5/2012 | Abou-Khalil | H02H 9/046 |
| | | | 361/56 |
| 2014/0036399 A1 | 2/2014 | Ory et al. | |
| 2014/0185167 A1 * | 7/2014 | Peng | H02H 9/046 |
| | | | 361/56 |
| 2015/0194420 A1 * | 7/2015 | Wang | H01L 27/0262 |
| | | | 257/133 |
| 2015/0318275 A1 * | 11/2015 | Chen | H01L 27/0266 |
| | | | 361/56 |
| 2016/0141287 A1 * | 5/2016 | He | H01L 27/0262 |
| | | | 257/133 |
| 2017/0155243 A1 * | 6/2017 | Tan | H02H 9/046 |
| 2017/0271322 A1 | 9/2017 | Russ et al. | |
| 2017/0278839 A1 * | 9/2017 | Lai | H01L 27/0255 |
| 2018/0287378 A1 * | 10/2018 | Sithanandam | H02H 9/046 |
| 2019/0165571 A1 * | 5/2019 | Batra | H01L 27/0255 |
| 2019/0267801 A1 | 8/2019 | Kumar et al. | |
| 2019/0319453 A1 * | 10/2019 | Sithanandam | H01L 27/0255 |

OTHER PUBLICATIONS

Maloney, Timothy J. et al.: "Methods for Designing Low-Leakage Power Supply Clamps," 2003 EOS/ESD Symposium (7 pages).

Stockinger, Michael et al.: "Boosted and Distributed Rail Clamp Networks for ESD Protection in Advanced CMOS Technologies," 2003 Electrical Overstress: Electrostatic Discharge Symposium (10 pages).

Bourgeat, et al.: "Single and Compact ESD Device Beta-Matrix Solution Based on Bidirectional SCR Network in Advanced 28/32 NM Technology Node," Solid State Electronics, vol. 87, Sep. 2013 (pp. 34-42).

Sithanandam, Radhakrishnan et al: "A Novel Cascade-Free 5-V ESD Clamp Using I-MOS: Proposal and Analysis," IEEE Transactions on Device and Materials Reliabiity, vol. 16, No. 2, Jun. 2016 (pp. 200-207).

* cited by examiner

INTEGRATED SILICON CONTROLLED RECTIFIER (SCR) AND A LOW LEAKAGE SCR SUPPLY CLAMP FOR ELECTROSTATIC DISCHARGE (ESP) PROTECTION

TECHNICAL FIELD

The present invention relates to an integrated silicon controlled rectifier (SCR) and a device that utilizes an SCR for protecting an integrated circuit against overvoltages and, in particular, against electrostatic discharges.

BACKGROUND

A circuit diagram of a conventional silicon controlled rectifier (SCR) 11 is shown in FIG. 1. The SCR 11 includes an anode terminal (A) and a cathode terminal (C). The SCR 11 is an integrated device formed by a bipolar PNP transistor 13, a bipolar NPN transistor 15, a first (p-type) substrate resistance 17 and a second (n-type) substrate resistance 19. The emitter of the bipolar PNP transistor 13 is coupled to the anode terminal A and the collector of the bipolar PNP transistor 13 is coupled to a first node 21. The first substrate resistance 17 is coupled between the first node 21 and the cathode terminal C. The emitter of the bipolar NPN transistor 15 is coupled to the cathode terminal C and the collector of the bipolar NPN transistor 15 is coupled to a second node 23. The second substrate resistance 19 is coupled between the second node 23 and the anode terminal A. The SCR 11 is a switching circuit configured to conduct high current. As known to those skilled in the art, the switching mechanism of the SCR 11 occurs as a result of regenerative feedback by the bipolar transistors 13 and 15 that are connected in a back-to-back configuration.

In operation, if the voltage at the anode terminal A exceeds the voltage at the cathode terminal C by the threshold (or triggering) voltage, the SCR 11 turns on and current flows between the anode terminal A and cathode terminal C through regenerative feedback by the bipolar transistors 13 and 15. Current continues to flow for so long as the voltage at the anode terminal A exceeds a holding voltage which is the minimum potential required to sustain the regenerative feedback. If the voltage at the anode terminal A falls below the holding voltage, the SCR 11 turns off.

A cross-sectional diagram of a conventional integrated circuit implementation of the silicon controlled rectifier (SCR) 11 is shown in FIG. 2. A semiconductor substrate 31 is lightly doped with a p-type dopant. A well 33 is formed in the substrate 31 and doped with an n-type dopant. Insulating trenches 35 are provided in the upper surface of the substrate 31. A heavily doped n-type region 37 provides a contact 23' (if desired) to the second node 23 and another heavily doped n-type region 39 provides the cathode terminal C and the emitter of the bipolar NPN transistor 15. A heavily doped p-type region 41 provides a contact 21' (if desired) to the first node 21 and another heavily doped p-type region 43 provides the anode terminal A and the emitter of the bipolar PNP transistor 13. The semiconductor substrate 31 provides the first (p-type) substrate resistance 17 and base of the bipolar transistor 15. The well 33 provides the second (n-type) substrate resistance 19 and base of the bipolar transistor 13.

FIG. 3 shows a circuit diagram for a conventional supply clamp circuit 51 for electrostatic discharge (ESD) protection in an integrated circuit. The supply clamp circuit 51 includes a switching circuit 53 coupled between a first supply line 55 of the integrated circuit and a second supply line 57 of the integrated circuit. The first supply line 55 is coupled to a positive power supply pad 63 for the integrated circuit and the second supply line 57 is coupled to a negative or ground power supply pad 65 for the integrated circuit. The functional circuit 67 to be protected is also coupled between the first supply line 55 and the second supply line 57. The switching circuit 53 has a first conduction terminal 73 coupled to the first supply line 55 and a second conduction terminal 75 coupled to the second supply line 57. A control terminal 77 of the switching circuit 53 receives a trigger signal generated by a trigger circuit 81 that senses a transient voltage difference in the first or second supply lines 55 and 57, respectively, and asserts the trigger signal in response to the sensed difference. The switching circuit 53 turns on in response to the trigger signal to connect the first and second supply lines and conduct current of the ESD event between the first and second supply lines.

In this embodiment, the switching circuit 53 is formed by the SCR 11 as shown in FIGS. 1-2 where the first conduction terminal 73 is the anode terminal A with a direct electrical connection of the first supply line 55 to the heavily doped p-type region 43, the second conduction terminal 75 is the cathode terminal with a direct electrical connection of the second supply line 57 to the heavily doped n-type region 39 and the control terminal 77 is the control gate terminal of the SCR 11 where the trigger signal is applied to a p-type control gate at the contact node 21'.

The trigger circuit 81 comprises an ESD detection circuit 83 and a trigger signal conditioning circuit 85. The ESD detection circuit 83 is formed by a resistive-capacitive (RC) circuit comprising a resistor 91 connected in series with a capacitor 93 between the first and second supply lines 55 and 57. A first terminal of the resistor 91 is connected to the second supply line 57 and a second terminal of the resistor 91 is connected to node 95. A first plate of the capacitor 93 is connected to node 95 and a second plate of the capacitor 93 is connected to the first supply line 55. The trigger signal conditioning circuit 85 comprises first and second inverter circuits 97 and 99, respectively, connected in series with each other. The inverter circuits 97 and 99 are powered from the first and second supply lines 55 and 57, with an input of the inverter circuit 97 connected to node 95, an output of inverter circuit 97 connected to an input of inverter circuit 99 and an output of inverter circuit 99 connected to the control terminal 77 of the switching circuit 53. In some implementations, the trigger signal conditioning circuit 85 may be omitted with node 95 directly connected to the control terminal 77 of the switching circuit 53.

The circuit 51 may further include a return diode 59 connected between the first and second supply lines 55 and 57 in a manner well known to those skilled in the art with the cathode terminal connected to the first supply line 55 and the anode terminal connected to the second supply line 57.

The most important operating parameters of the SCR 11 are the threshold (or triggering) voltage (setting the voltage condition under which the SCR turns on) and the holding voltage (setting the minimum potential maintain the on state of the SCR). Typically, the holding voltage is less than the supply voltage, and as a result the SCR 11 may accidentally enter a latch-up mode. There is a need in the art to address this concern in connection with providing an SCR that is well suited for use in a supply clamp circuit.

SUMMARY

In an embodiment, an electrostatic discharge (ESD) protection circuit comprises: a first power supply line; a second power supply line; a trigger circuit configured to generate, in response to detection of an ESD event at one or more of the first and second power supply lines, at least one trigger signal; and a silicon controlled rectifier (SCR) having an anode terminal connected to the first power supply line and a cathode terminal connected to the second power supply line; wherein the SCR further includes an embedded field effect transistor (FET) having an insulated gate which forms a control gate terminal coupled to receive said at least one trigger signal.

In an embodiment, an electrostatic discharge (ESD) protection circuit comprises: a first power supply line; a second power supply line; a trigger circuit configured to generate, in response to detection of an ESD event at one or more of the first and second power supply lines, at least one trigger signal; and a silicon controlled rectifier (SCR) having an anode terminal connected to the first power supply line and a cathode terminal connected to the second power supply line; wherein the SCR includes an embedded variable substrate resistor having an insulated gate which forms a control gate terminal coupled to receive said at least one trigger signal.

In an embodiment, an integrated circuit silicon controlled rectifier (SCR) comprises an anode terminal, a cathode terminal, and a control gate terminal, wherein the SCR includes an embedded field effect transistor (FET) having an insulated gate which forms the control gate terminal.

In an embodiment, an integrated circuit silicon controlled rectifier (SCR) comprises an anode terminal, a cathode terminal, and a control gate terminal, wherein the SCR includes an embedded variable substrate resistor having an insulated gate which forms the control gate terminal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 4:
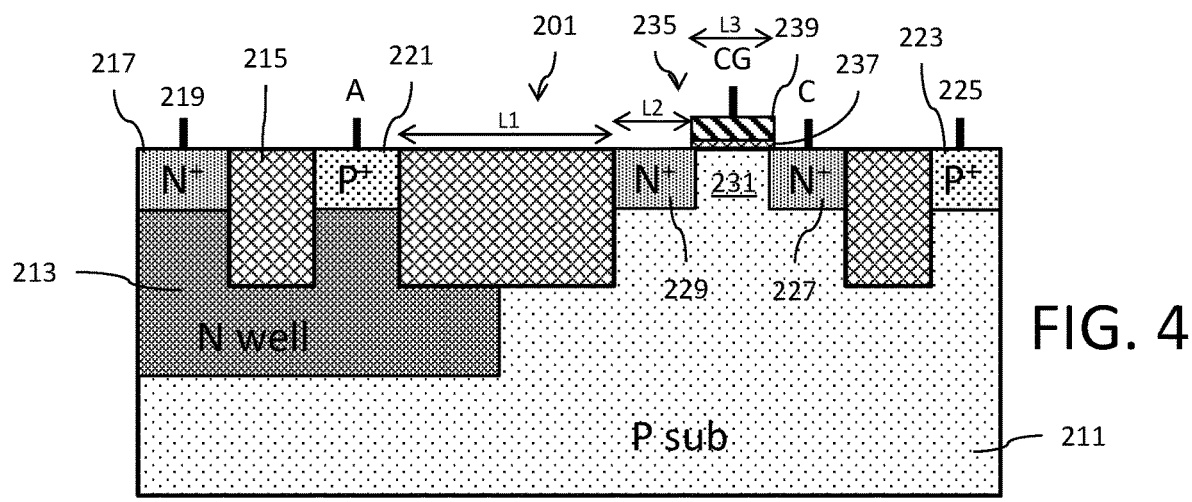
FIG. 4 is a cross-sectional diagram of an integrated circuit implementation of a SCR.

Reference is now made to FIG. 4 showing a cross-sectional diagram of an integrated circuit implementation of a silicon controlled rectifier (SCR) 201. A semiconductor substrate 211 is lightly doped with a p-type dopant. A well 213 is formed in the substrate 211 and doped with an n-type dopant. Insulating trenches 215 are provided in the upper surface of the substrate 211. A heavily doped n-type region 217 within the well 213 provides an n-type gate node 219. A heavily doped p-type region 221 also within the well 213 provides the anode terminal (A) of the SCR 201 and the emitter of the included PNP bipolar transistor. The regions 217 and 221 are separated from each other by the insulating trench 215. The region 221 is also separated from the substrate 211 by the insulating trench 215. A heavily doped p-type region 223 within the substrate 211 provides a p-type gate node 225. A first heavily doped n-type region 227 also within the substrate 211 provides the cathode terminal (C) of the SCR 201 and the emitter of the included NPN bipolar transistor. The region 225 is separated from the region 227 by the insulating trench 215. A second heavily doped n-type region 229 is also provided within the substrate 211. The regions 227 and 229 are separated from each other by a portion 231 of the substrate 211. The region 229 is separated from the well 213 by the insulating trench 215. An insulated gate 235 is formed above the portion 231 to provide a control gate (CG) for the SCR 201. The insulated gate 235 includes a gate oxide layer 237 on the surface of the substrate 211 over the portion 231 and a gate electrode 239 over the gate oxide layer 237. The regions 227 and 229, portion 231 and insulated gate 235 form a metal oxide semiconductor field effect transistor (MOSFET) device, in this case more specifically an n-channel device (nMOS). The regions 227 and 229 form conduction (i.e., source, drain) regions of the MOSFET and the portion 231 forms the channel region of the MOSFET.

Reference L1 refers to the length of the insulating trench 215 separating the regions 221 and 229. Reference L2 refers to the length of the region 229 from the insulating trench 215 to the insulated gate 235. Reference L3 refers to the length of the insulated gate 235. These lengths L1, L2 and L3 are configurable during design of the SCR 201 and have an effect on setting the operational parameters of the SCR 201 in a manner understood by those skilled in the art.

Figure 5:
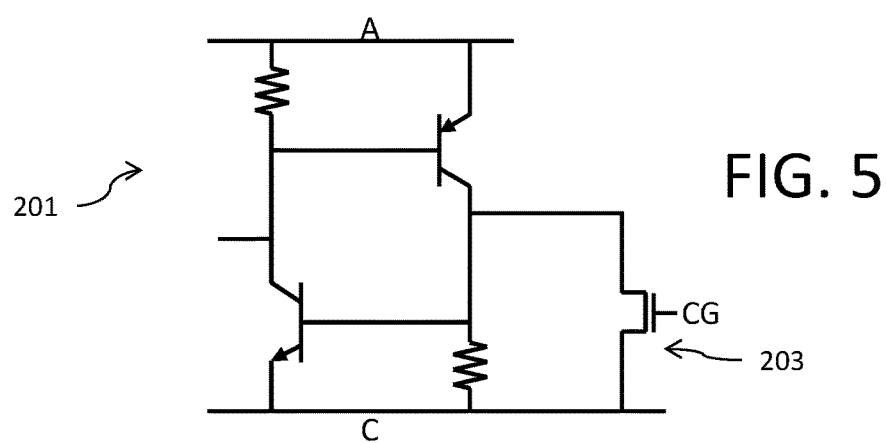
FIG. 5 is a schematic circuit diagram of the SCR of FIG. 4.

FIG. 5 shows the equivalent circuit schematic of the SCR 201 shown in FIG. 4. The SCR 201 of FIG. 4 is of a type which includes an embedded n channel MOSFET 203 for controlling triggering the SCR device to turn on.

Figure 3:
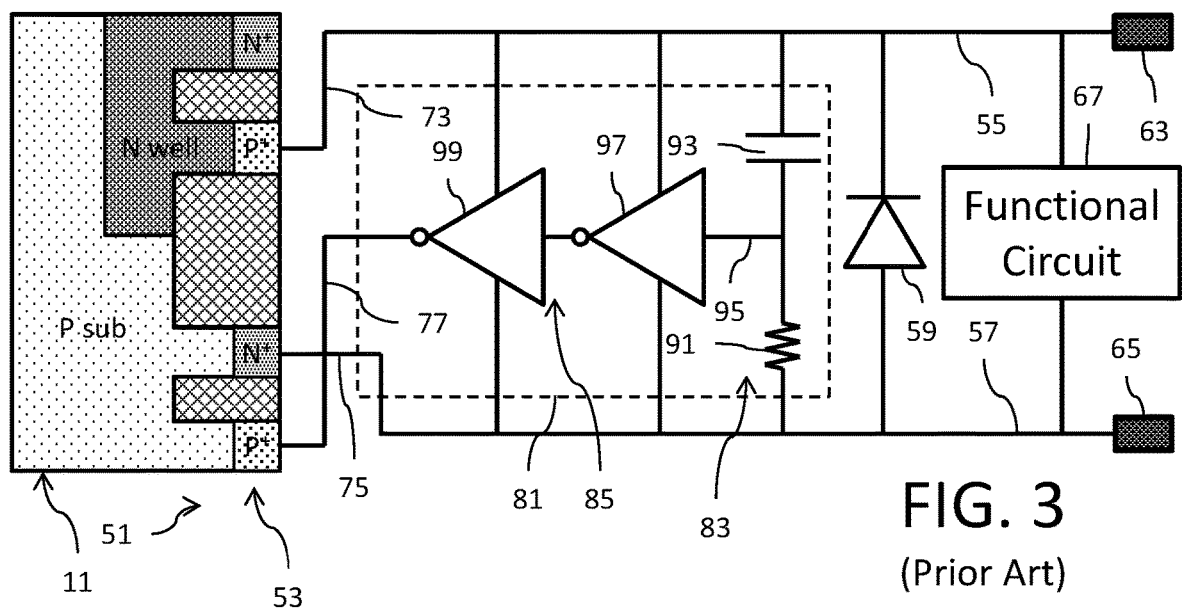
FIG. 3 is a circuit diagram for a conventional supply clamp circuit for electrostatic discharge (ESD) protection that uses the SCR of FIGS. 1-2 for a switching device.
Figure 6:
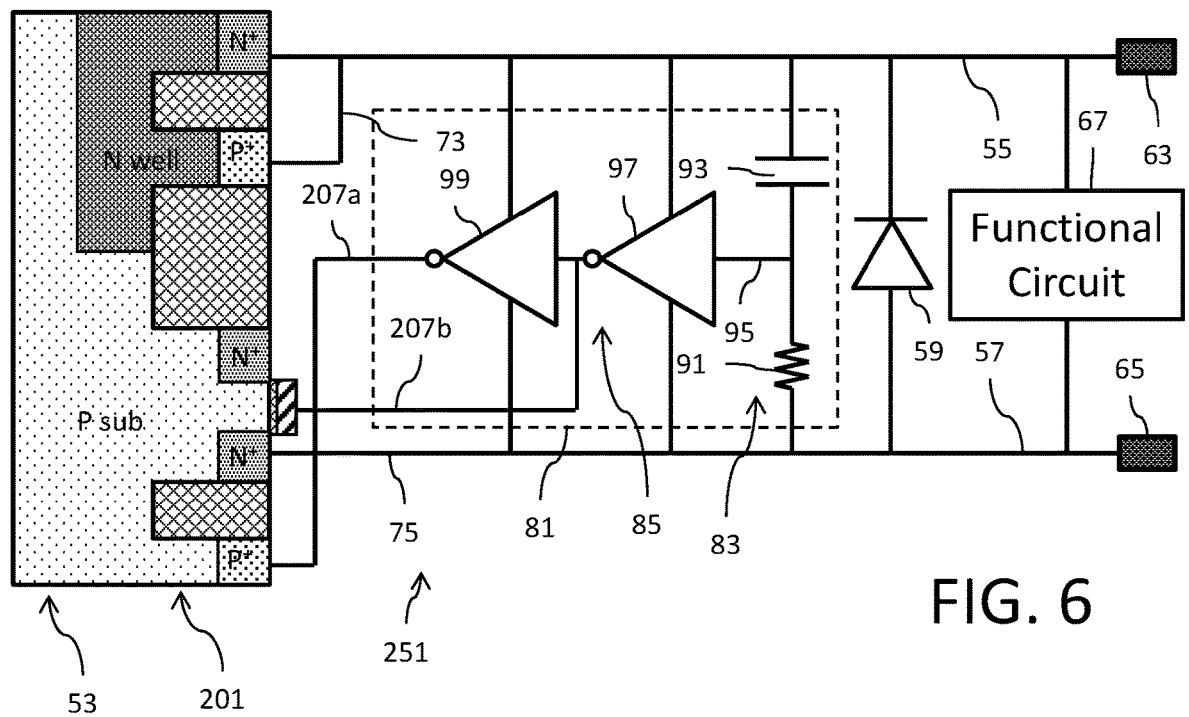
FIGS. 6-8 show implementations of supply clamp circuits for ESD protection that use the SCR of FIGS. 4-5.

FIG. 6 shows an implementation of a supply clamp circuit 251 for electrostatic discharge (ESD) protection that uses the SCR 201 of FIGS. 4-5. Like reference numbers in FIGS. 3 and 6 refer to like or similar components. The circuit 251 differs from the circuit 51 in that the switching circuit 53 is implemented using the SCR 201 of FIGS. 4-5. The n-type gate node 219 and the anode terminal A are directly electrically connected to each other and to the first supply line 55. The cathode terminal C is directly electrically connected to the second supply line 57. The p-type gate node 225 is driven by a first trigger signal 207a output from the trigger circuit 81 and the control gate CG is driven by a second trigger signal 207b. The first and second trigger signals 207a and 207b are logical inversions of each other. With the trigger circuit 81 shown in FIG. 6, the first trigger signal 207a is generated at the output of the inverter 99 and the second trigger signal 207b is generated at the output of the inverter 97.

The supply clamp circuit 251 operates as follows: the trigger circuit 81 senses a transient voltage difference in the first or second supply lines 55 and 57, respectively, and generates an ESD event sense signal at node 95. In response to the ESD event signal, the first and second trigger signals 207a and 207b of opposite logic state are generated. The SCR 201 turns on in response to the first and second trigger signals 207a and 207b.

The circuit 251 of FIG. 6 may be fabricated as an integrated circuit in an implementation where the trigger circuit 81 is implemented in a portion using fully-depleted silicon on insulator (FDSOI) or finFET on SOI technology, the return diode 59 is implemented in bulk technology and the SCR 201 is implemented in a hybrid region.

Figure 7:
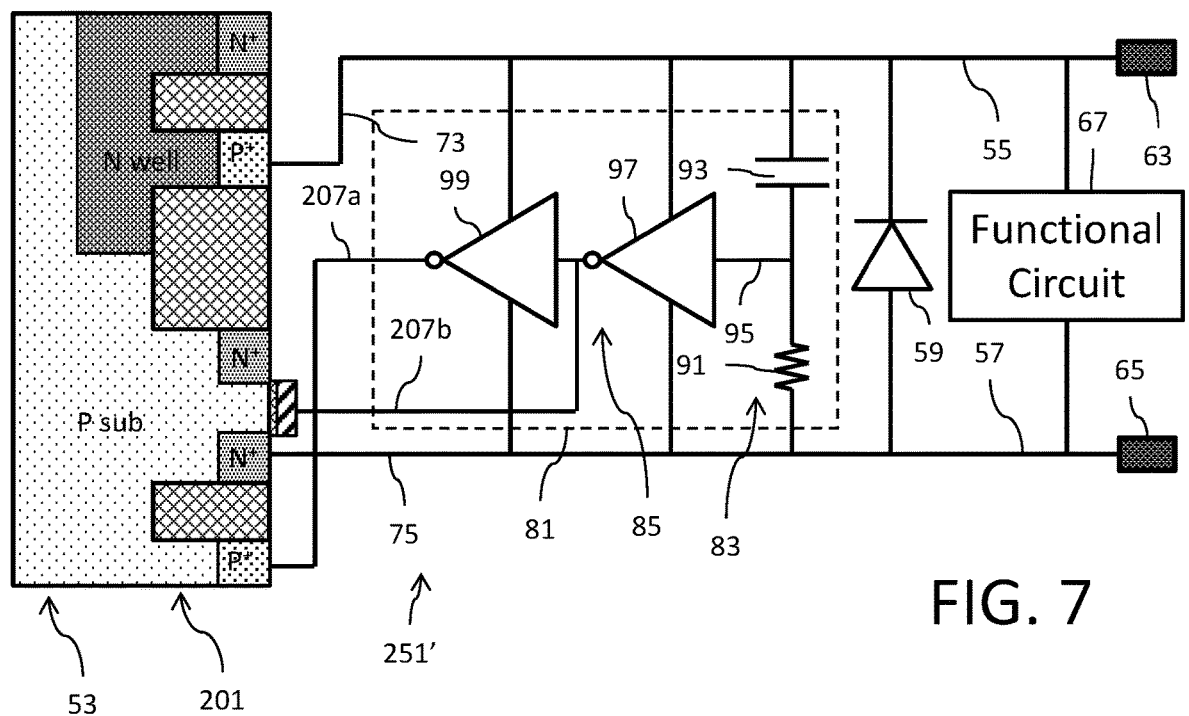

FIG. 7 shows another implementation of a supply clamp circuit 251' for ESD protection that uses the SCR 201 of FIGS. 4-5. The circuit 251' differs from the circuit 251 in that the heavily doped n-type region 217 within the well 213 providing the n-type gate node 219 is left floating.

Figure 8:
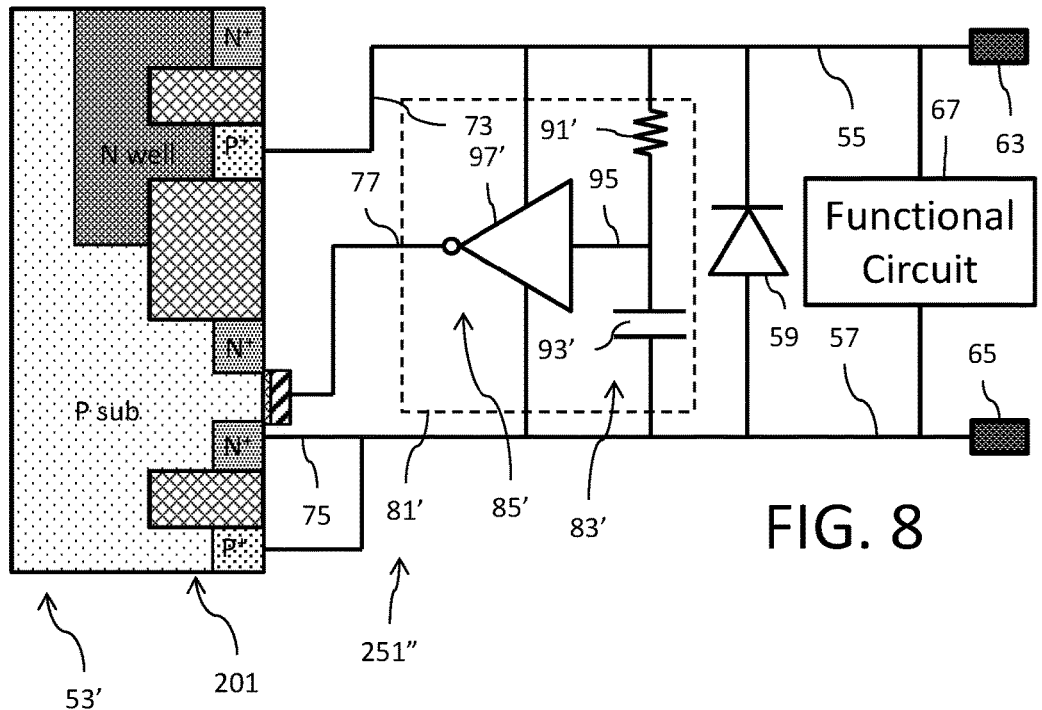

FIG. 8 shows another implementation of a supply clamp circuit 251" for ESD protection that uses the SCR 201 of FIGS. 4-5. The supply clamp circuit 251" includes a switching circuit 53' coupled between the first supply line 55 and the second supply line 57. A control terminal 77 of the switching circuit 53' receives a trigger signal generated by a trigger circuit 81' that senses a transient voltage difference in the first or second supply lines 55 and 57, respectively, indicative of an ESD event and asserts the trigger signal in response to the detected ESD event. The trigger circuit 81' comprises an ESD detection circuit 83' and a trigger signal conditioning circuit 85'. The ESD detection circuit 83' is formed by a resistive-capacitive (RC) circuit comprising a resistor 91' connected in series with a capacitor 93' between the first and second supply lines 55 and 57. A first terminal of the resistor 91' is connected to the first supply line 55 and a second terminal of the resistor 91 is connected to node 95. A first plate of the capacitor 93' is connected to node 95 and a second plate of the capacitor 93' is connected to the second supply line 57. The trigger signal conditioning circuit 85' comprises an inverter circuit 97' powered from the first and second supply lines 55 and 57, with an input of the inverter circuit 97' connected to node 95 and an output of inverter circuit 97' connected to the control terminal 77 of the switching circuit 53'.

In this embodiment, the switching circuit 53' is implemented using the SCR 201 of FIGS. 4-5. The control gate CG is directly electrically connected to the control terminal 77 to receive the trigger signal generated at the output of the inverter circuit 97'. The anode terminal A is directly electrically connected to the first supply line 55. The cathode terminal C and the p-type gate node 125 are directly electrically connected to each other and to the second supply line 57.

The supply clamp circuit 251" operates as follows: the trigger circuit 81' senses a transient voltage difference in the first or second supply lines 55 and 57, respectively, and generates an ESD event sense signal at node 95. The trigger signal is generated in response to the ESD event sense signal and the SCR 201 is turned on.

The circuit 251" of FIG. 8 may be fabricated as an integrated circuit in an implementation where the trigger circuit 81' is implemented in a portion using fully-depleted silicon on insulator (FDSOI) or finFET on SOI technology, the return diode 59 is implemented in bulk technology and the SCR 201 is implemented in a hybrid region.

Figure 1:
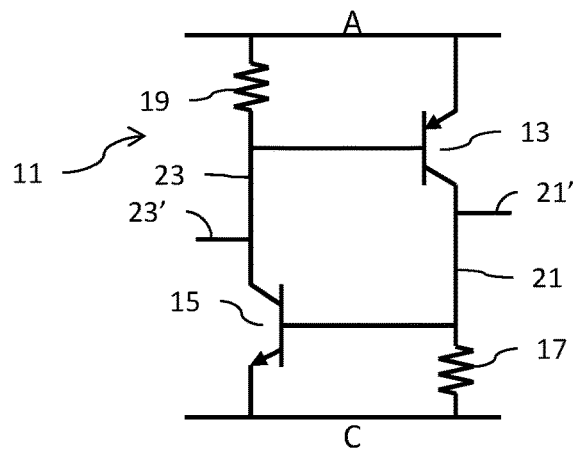
FIG. 1 shows a schematic circuit diagram of a conventional silicon controlled rectifier (SCR) circuit.
Figure 2:
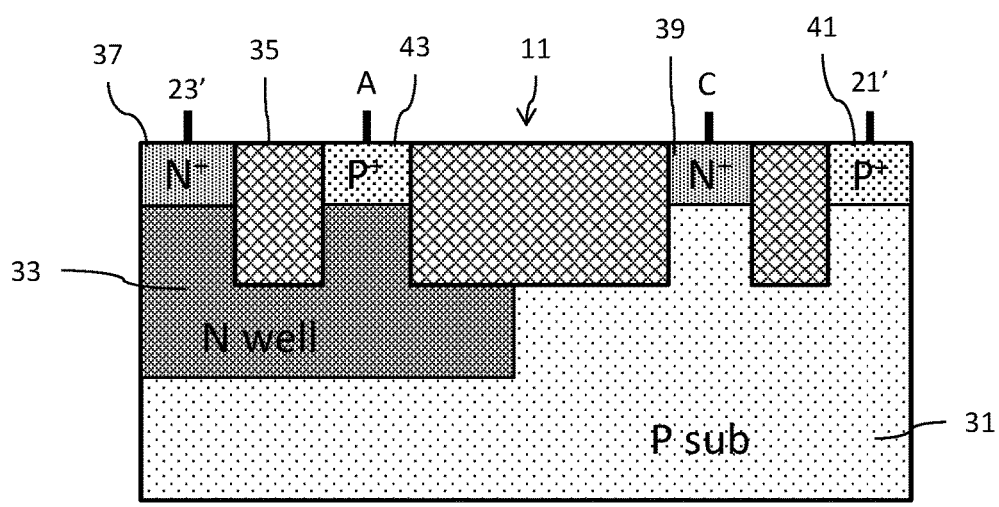
FIG. 2 is a cross-sectional diagram of a conventional integrated circuit implementation of the SCR of FIG. 1.
Figure 9:
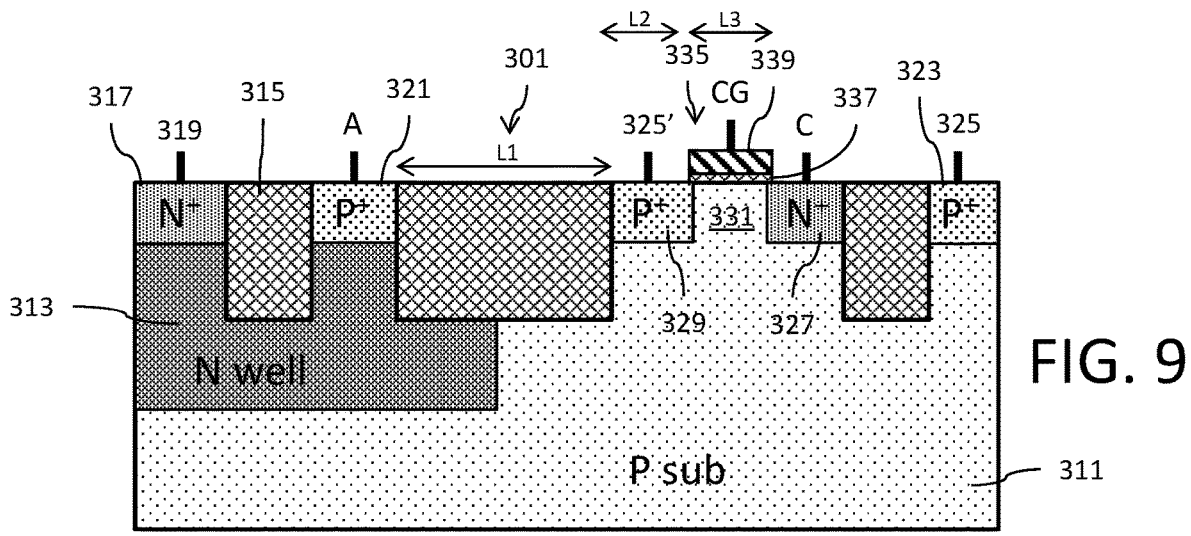
FIG. 9 is a cross-sectional diagram of an integrated circuit implementation of a SCR.

Reference is now made to FIG. 9 showing a cross-sectional diagram of an integrated circuit implementation of a silicon controlled rectifier (SCR) 301. A semiconductor substrate 311 is lightly doped with a p-type dopant. A well 313 is formed in the substrate 311 and doped with an n-type dopant. Insulating trenches 315 are provided in the upper surface of the substrate 311. A heavily doped n-type region 317 within the well 313 provides an n-type gate node 319. A heavily doped p-type region 321 also within the well 313 provides the anode terminal (A) of the SCR 301 and the emitter of the included PNP bipolar transistor. The regions 317 and 321 are separated from each other by the insulating trench 315. The region 321 is also separated from the substrate 311 by the insulating trench 315. A heavily doped p-type region 323 within the substrate 311 provides a p-type gate node 325. A heavily doped n-type region 327 also within the substrate 311 provides the cathode terminal (C) of the SCR 301 and the emitter of the included NPN bipolar transistor. The region 325 is separated from the region 327 by the insulating trench 315. A heavily doped p-type region 329 is also provided within the substrate 311 as a further p-type gate node 325'. The regions 327 and 329 are separated from each other by a portion 331 of the substrate 311. The region 329 is separated from the well 313 by the insulating trench 315. An insulated gate 335 is formed above the portion 331 to provide a control gate (CG) for the SCR 301. The insulated gate 335 includes a gate oxide layer 337 on the surface of the substrate 311 over the portion 331 and a gate electrode 339 over the gate oxide layer 337. The regions 327 and 329, portion 331 and insulated gate 335 form a variable resistance circuit for the substrate resistance (compare to reference 17 of FIG. 1) that is coupled between the collector of the PNP transistor and the cathode terminal C.

Reference L1 refers to the length of the insulating trench 315 separating the regions 321 and 329. Reference L2 refers to the length of the region 329 from the insulating trench 315 to the insulated gate 335. Reference L3 refers to the length of the insulated gate 335. These lengths L1, L2 and L3 are configurable during design of the SCR 301 and have an effect on setting the operational parameters of the SCR 301 in a manner well known to those skilled in the art.

Figure 10:
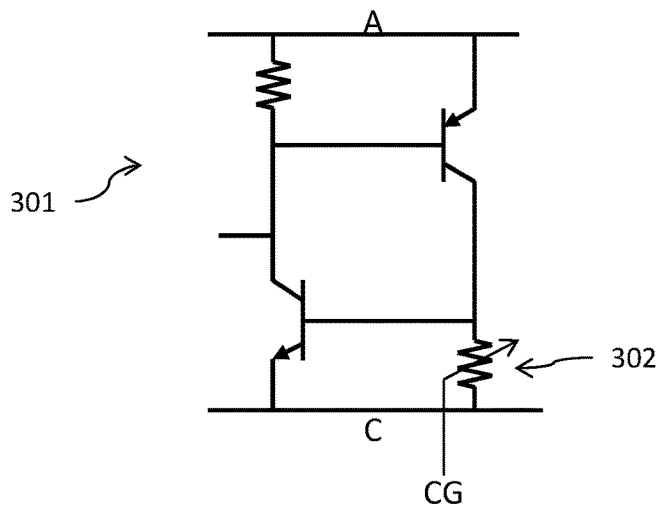
FIG. 10 is a schematic circuit diagram of the SCR of FIG. 9.
Figure 12:
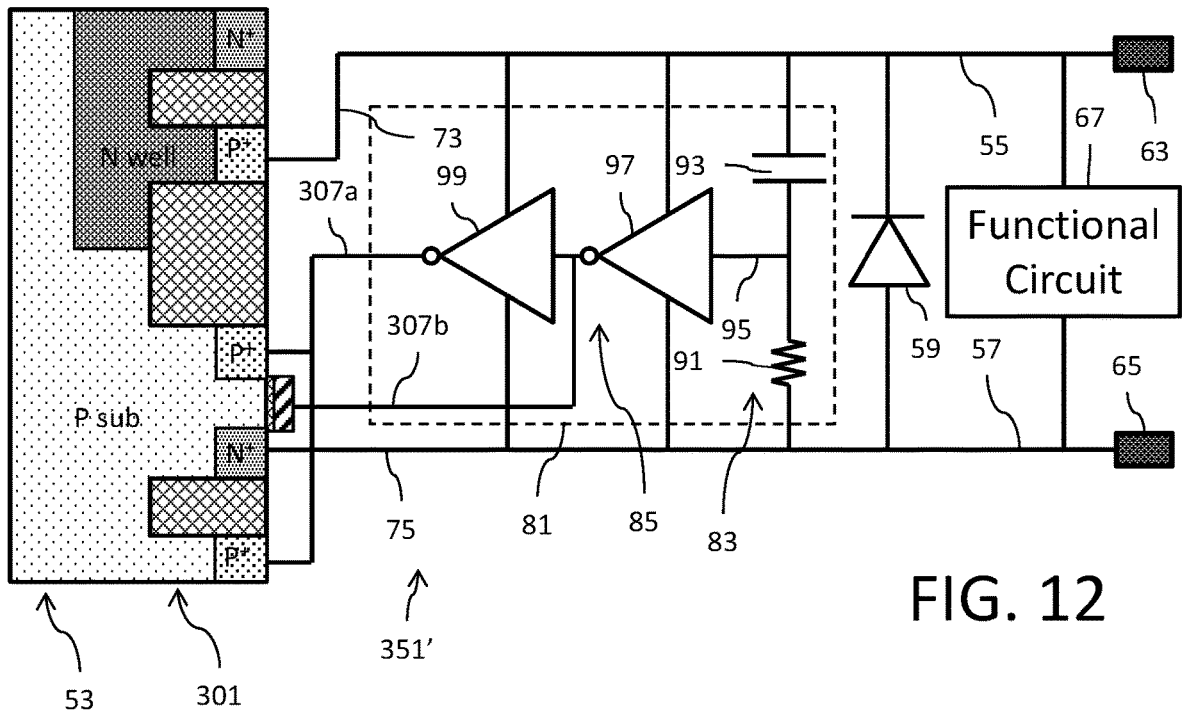
Figure 13:
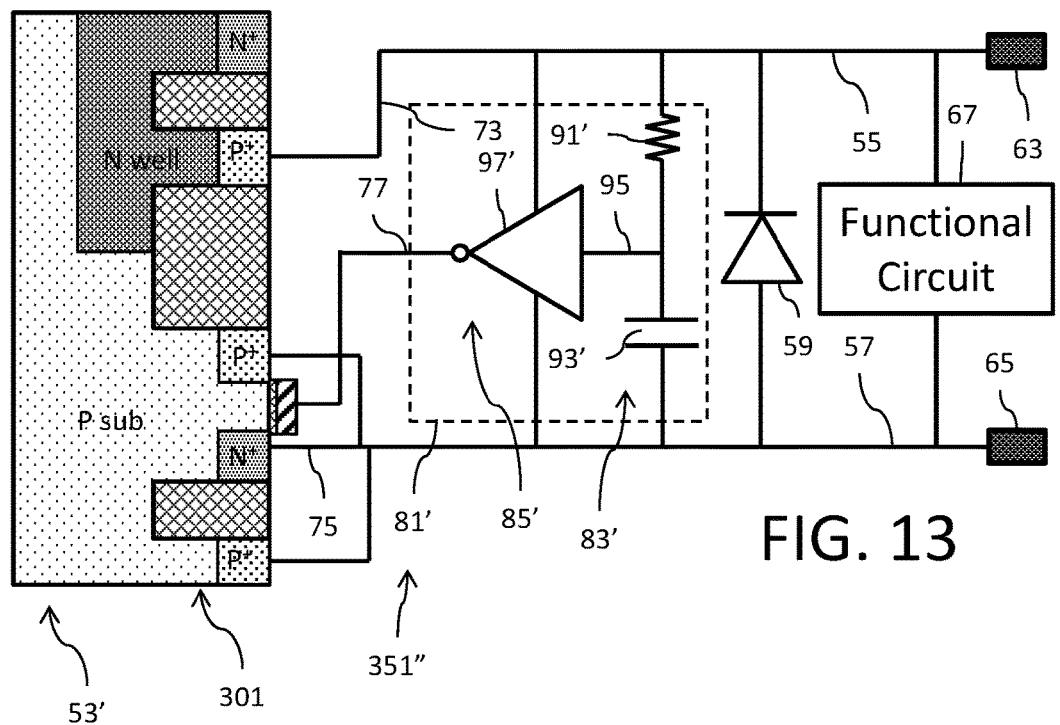

FIG. 10 shows the equivalent circuit schematic of the SCR 301 shown in FIG. 12. The SCR 301 of FIG. 13 is of a type which includes an embedded variable substrate resistor 302.

Figure 11:
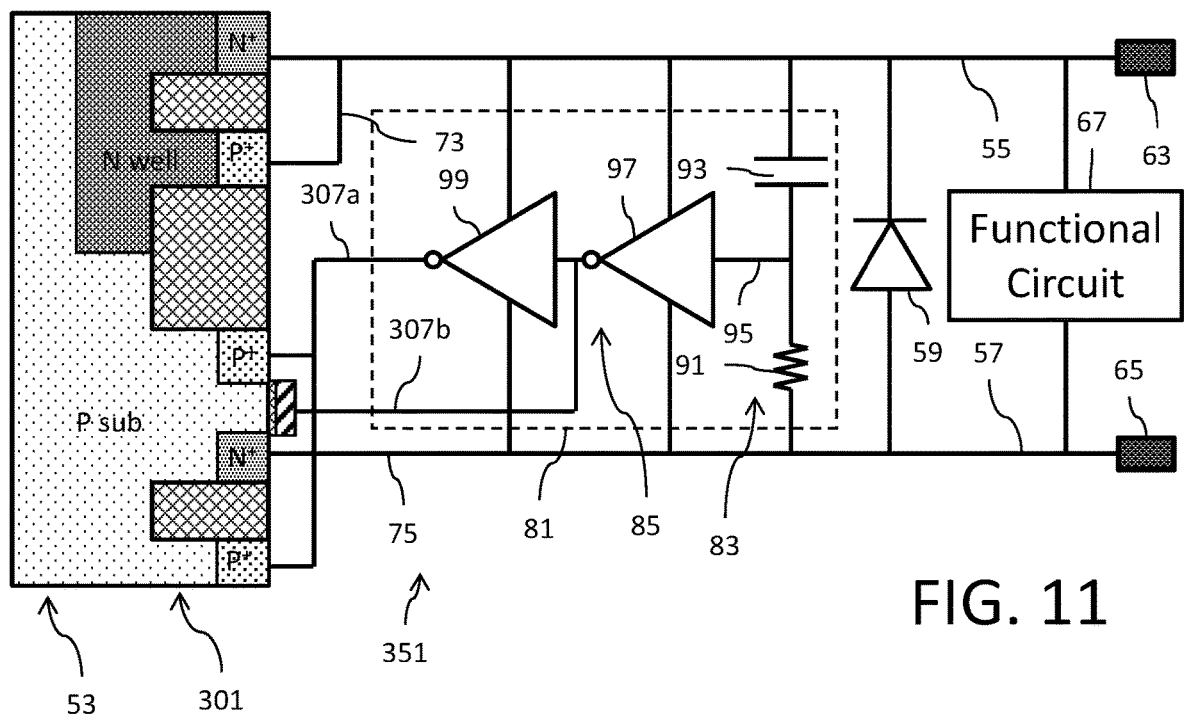
FIGS. 11-13 show implementations of supply clamp circuits for ESD protection that use the SCR of FIGS. 9-10.

FIG. 11 shows an implementation of a supply clamp circuit 351 for electrostatic discharge (ESD) protection that uses the SCR 301 of FIGS. 9-10. Like reference numbers in FIGS. 6 and 11 refer to like or similar components. The circuit 351 differs from the circuit 251 in that the switching circuit 53 is implemented using the SCR 301 of FIGS. 9-10. The n-type gate node 319 and the anode terminal A are directly electrically connected to each other and to the first supply line 55. The cathode terminal C is directly electrically connected to the second supply line 57. The p-type gate nodes 325 and 325' are directly electrically connected to each other and are driven by a first trigger signal 307a output from the trigger circuit 81. The control gate CG is driven by a second trigger signal 307b. The first and second trigger signals 307a and 307b are logical inversions of each other. With the trigger circuit 81 shown in FIG. 11, the first trigger signal 307a is generated at the output of the inverter 99 and the second trigger signal 307b is generated at the output of the inverter 97.

The supply clamp circuit 351 operates as follows: the trigger circuit 81 senses a transient voltage difference in the first or second supply lines 55 and 57, respectively, and generates an ESD event sense signal at node 95. The first and second trigger signals 307a and 307b of opposite logic state are generated in response to the ESD even signal. The SCR 301 is turned on in response to the first and second trigger signals 307a and 307b.

The circuit 351 of FIG. 11 may be fabricated as an integrated circuit in an implementation where the trigger circuit 81 is implemented in a portion using fully-depleted silicon on insulator (FDSOI) of finFET on SOI technology, the return diode 59 is implemented in bulk technology and the SCR 301 is implemented in a hybrid region.

FIG. 12 shows another implementation of a supply clamp circuit 351' for ESD protection that uses the SCR 301 of FIGS. 9-10. The circuit 351' differs from the circuit 351 in that the heavily doped n-type region 317 within the well 313 providing the n-type gate node 319 is left floating.

FIG. 13 shows another implementation of a supply clamp circuit 351" for ESD protection that uses the SCR 301 of FIGS. 9-10. Like reference numbers in FIGS. 8 and 13 refer to like or similar components. The circuit 351" differs from the circuit 251" in that the switching circuit 53 is implemented using the SCR 301 of FIGS. 9-10. The control gate CG is directly electrically connected to the control terminal 77 to receive the trigger signal generated at the output of the inverter circuit 97'. The anode terminal A is directly electrically connected to the first supply line 55. The cathode terminal C and the p-type gate nodes 325 and 325' are directly electrically connected to each other and to the second supply line 57.

The supply clamp circuit 351" operates as follows: the trigger circuit 81' senses a transient voltage difference in the first or second supply lines 55 and 57, respectively, and generates an ESD event sense signal at node 95. The trigger signal is generated in response to the ESD event signal and turns on the SCR 301.

The circuit 351" of FIG. 13 may be fabricated as an integrated circuit in an implementation where the trigger circuit 81' is implemented in a portion using fully-depleted silicon on insulator (FDSOI) or finFET on SOI technology, the return diode 59 is implemented in bulk technology and the SCR 101 is implemented in a hybrid region.

Figure 14:
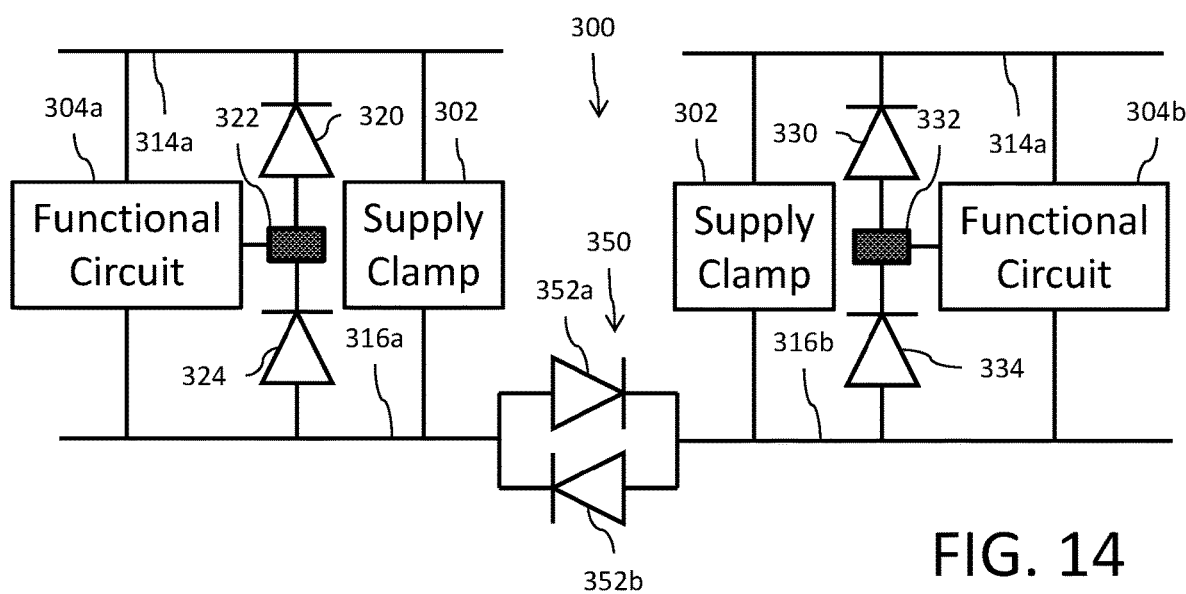
FIG. 14 shows a circuit diagram for an ESD network.

Reference is now made to FIG. 14 showing a ESD network 300 utilizing any one of the supply clamp circuits (generally referenced as 302) as shown by FIGS. 6-8 and 11-13. An integrated circuit may include multiple power supply domains for functional circuits supported on a common substrate. FIG. 14 shows a configuration with a first power supply domain for a first functional circuit 304a including a first power supply line 314a and a second power supply line 316a, and a second power supply domain for a second functional circuit 304b including a first power supply line 314b and a second power supply line 316b. In this implementation, the first supply line 314a of the first power supply domain may be coupled to a positive power supply pad for the integrated circuit and the second supply line 316a for the first power supply domain may be coupled to a negative or ground power supply pad for the integrated circuit. Likewise, the first supply line 314b of the second power supply domain may be coupled to a positive power supply pad for the integrated circuit and the second supply line 316b for the second power supply domain may be coupled to a negative or ground power supply pad for the integrated circuit. The power supply voltages in the first and second power supply domains are different.

ESD protection circuitry is provided for each power supply domain. That ESD protection circuitry includes a supply clamp circuit 302. Additional ESD protection circuitry for the ESD network 300 includes a first protection diode 320 coupled between a first input/output pad 322 and the first supply line 314a, and a second protection diode 324 coupled between the first input/output pad 322 and the second supply line 316a. The first protection diode 320 has an anode terminal coupled to the input/output pad 322 and a cathode terminal coupled to the first supply line 314a. The second protection diode 324 has a cathode terminal coupled to the first input/output pad 322 and an anode terminal coupled to the second supply line 316a. The input/output pad 322 is coupled to the first functional circuitry 304a of the integrated circuit that is power supplied from the first and second supply lines of the first power supply domain. The additional ESD protection circuitry for the ESD network 300 further includes a third protection diode 330 coupled between a second input/output pad 332 and the first supply line 314b, and a fourth protection diode 334 coupled between the second input/output pad 332 and the second supply line 316b. The third protection diode 330 has an anode terminal coupled to the input/output pad 332 and a cathode terminal coupled to the first supply line 314b. The fourth protection diode 334 has a cathode terminal coupled to the second input/output pad 332 and an anode terminal coupled to the second supply line 316b. The input/output pad 332 is coupled to the second functional circuitry 304b of the integrated circuit that is power supplied from the first and second supply lines of the second power supply domain.

The ESD network further includes a cutter circuit 350 coupled between the second supply line 316a for the first power supply domain and the second supply line 316b for the second power supply domain. The cutter circuit 350 is formed by a pair of diodes 352a and 352b coupled in a back to back (i.e., anti-parallel) configuration. The first diode 352a includes an anode coupled to the second supply line 316a for the first power supply domain and a cathode coupled to the second supply line 316b for the second power supply domain. The second diode 352b includes an anode coupled to the second supply line 3164b for the second power supply domain and a cathode coupled to the second supply line 316a for the first power supply domain.

The implementation of circuits shown in FIG. 14 is equally applicable any configuration of the supply nodes. For example, the circuit of FIG. 14 may be used in connection with: a multiple VDD and multiple ground configuration, a single VDD and multiple ground configuration, a multiple VDD and single ground configuration, and a single VDD and single ground configuration.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An electrostatic discharge (ESD) protection circuit, comprising:
   a first power supply line;
   a second power supply line;
   a functional circuit electrically coupled for power supply to the first and second power supply lines;
   an input/output pad coupled to the functional circuit;
   a first protection diode connected between the input/output pad and the first power supply line;
   a second protection diode connected between the input/output pad and the second power supply line;
   a trigger circuit configured to generate, in response to detection of an ESD event at one or more of the first and second power supply lines, at least one trigger signal; and a silicon controlled rectifier (SCR) having an anode terminal connected to the first power supply line and a cathode terminal connected to the second power supply line;

wherein the SCR further includes an embedded field effect transistor (FET) having an insulated gate which forms a control gate terminal coupled to receive said at least one trigger signal.

2. The ESD protection circuit of claim 1, wherein a conduction terminal of the embedded FET forms the cathode terminal of the SCR.

3. The circuit of claim 1, wherein the trigger circuit comprises:
a resistive-capacitive ESD detection circuit configured to generate an ESD detection signal;
a first inverter circuit having an input coupled to receive the ESD detection signal and an output configured to generate a first trigger signal; and
a second inverter circuit having an input coupled to the output of the first inverter circuit and an output configured to generate a second trigger signal;
wherein the first trigger signal is applied to the insulated gate of the embedded FET at the control gate terminal of the SCR.

4. The circuit of claim 3,
wherein the SCR is formed in a semiconductor substrate of a first conductivity type and includes a first region within the semiconductor substrate of the first conductivity type and having a higher doping level than the semiconductor substrate, and
wherein the second trigger signal is applied to the first region.

5. The circuit of claim 4, wherein the semiconductor substrate further includes a second region of a second conductivity type opposite the first conductivity type, said second region forming a conduction terminal of the embedded FET.

6. The circuit of claim 5, wherein the second region further forms the cathode terminal of the SCR.

7. The circuit of claim 1, wherein the trigger circuit comprises:
a resistive-capacitive ESD detection circuit configured to generate an ESD detection signal;
an inverter circuit having an input coupled to receive the ESD detection signal and an output configured to generate the trigger signal.

8. The circuit of claim 1, wherein the SCR is formed in a semiconductor substrate of a first conductivity type and includes a well of a second conductivity type opposite the first conductivity type, said well including a first region of the first conductivity type and having a higher doping level than the semiconductor substrate, said first region forming the anode terminal of the SCR.

9. The circuit of claim 8, wherein the well further includes a second region of the second conductivity type having higher doping level than the well, and wherein the second region is a floating region.

10. The circuit of claim 1, wherein the at least one trigger signal comprises a first trigger signal and a second trigger signal, and wherein the SCR is formed in a semiconductor substrate of a first conductivity type and includes a first region within the semiconductor substrate of the first conductivity type and having a higher doping level than the semiconductor substrate, and wherein the first trigger signal is applied to the insulated gate of the embedded FET at the control gate terminal of the SCR and the second trigger signal is applied to the first region.

11. The circuit of claim 10, wherein the first and second trigger signals are logical inversions.

12. The circuit of claim 10, wherein the semiconductor substrate further includes a second region of a second conductivity type opposite the first conductivity type, said second region forming a conduction terminal of the embedded FET.

13. The circuit of claim 12, wherein the second region further forms the cathode terminal of the SCR.

14. An electrostatic discharge (ESD) protection circuit, comprising:
a first power supply line;
a second power supply line;
a functional circuit electrically coupled for power supply to the first and second power supply lines;
an input/output pad coupled to the functional circuit;
a first protection diode connected between the input/output pad and the first power supply line;
a second protection diode connected between the input/output pad and the second power supply line;
a trigger circuit configured to generate, in response to detection of an ESD event at one or more of the first and second power supply lines, at least one trigger signal; and
a silicon controlled rectifier (SCR) having an anode terminal connected to the first power supply line and a cathode terminal connected to the second power supply line;
wherein the SCR further includes an embedded variable substrate resistor having an insulated gate which forms a control gate terminal coupled to receive said at least one trigger signal.

15. The ESD protection circuit of claim 14, wherein a conduction terminal of the variable substrate resistor forms the cathode terminal of the SCR.

16. The circuit of claim 14, wherein the trigger circuit comprises:
a resistive-capacitive ESD detection circuit configured to generate an ESD detection signal;
a first inverter circuit having an input coupled to receive the ESD detection signal and an output configured to generate a first trigger signal; and
a second inverter circuit having an input coupled to the output of the first inverter circuit and an output configured to generate a second trigger signal;
wherein the first trigger signal is applied to the insulated gate of the embedded variable substrate resistor at the control gate terminal of the SCR.

17. The circuit of claim 16,
wherein the SCR is formed in a semiconductor substrate of a first conductivity type and includes a first region within the semiconductor substrate of the first conductivity type and having a higher doping level than the semiconductor substrate, and
wherein the second trigger signal is applied to the first region.

18. The circuit of claim 17, wherein the semiconductor substrate further includes a second region of a second conductivity type opposite the first conductivity type, said second region forming a conduction terminal of the variable substrate resistor.

19. The circuit of claim 18, wherein the second region further forms the cathode terminal of the SCR.

20. The circuit of claim 14, wherein the trigger circuit comprises:
a resistive-capacitive ESD detection circuit configured to generate an ESD detection signal;
an inverter circuit having an input coupled to receive the ESD detection signal and an output configured to generate the trigger signal.

21. The circuit of claim 14, wherein the SCR is formed in a semiconductor substrate of a first conductivity type and includes a well of a second conductivity type opposite the first conductivity type, said well including a first region of the first conductivity type and having a higher doping level than the semiconductor substrate, said first region forming the anode terminal of the SCR.

22. The circuit of claim 21, wherein the well further includes a second region of the second conductivity type having higher doping level than the well, and wherein the second region is a floating region.

23. The circuit of claim 14, wherein the at least one trigger signal comprises a first trigger signal and a second trigger signal, and wherein the SCR is formed in a semiconductor substrate of a first conductivity type and includes a first region within the semiconductor substrate of the first conductivity type and having a higher doping level than the semiconductor substrate, and
wherein the first trigger signal is applied to the insulated gate of the variable substrate resistor at the control gate terminal of the SCR and the second trigger signal is applied to the first region.

24. The circuit of claim 23, wherein the first and second trigger signals are logical inversions.

25. The circuit of claim 23, wherein the semiconductor substrate further includes a second region of a second conductivity type opposite the first conductivity type, said second region forming a conduction terminal of the variable substrate resistor.

26. The circuit of claim 25, wherein the second region further forms the cathode terminal of the SCR.

27. An integrated circuit silicon controlled rectifier (SCR), comprising:
a semiconductor substrate of a first conductivity type;
an embedded field effect transistor (FET) having an insulated gate which forms a control gate terminal;
a well of a second conductivity type opposite the first conductivity type within the semiconductor substrate;
a first region of the first conductivity type located within the well and having a higher doping level than the semiconductor substrate, said first well forming an anode terminal of the SCR;
a second region of the second conductivity type located within the semiconductor substrate, said second region forming a cathode terminal of the SCR and a first conduction terminal of the embedded FET; and
a third region of the second conductivity type located within the semiconductor substrate, said third region forming a second conduction terminal of the embedded FET.

28. An integrated circuit silicon controlled rectifier SCR comprising:
a semiconductor substrate of a first conductivity type;
an embedded variable substrate resistor having an insulated gate which forms a control gate terminal;
a well of a second conductivity type opposite the first conductivity type within the semiconductor substrate;
a first region of the first conductivity type located within the well and having a higher doping level than the semiconductor substrate, said first well forming an anode terminal of the SCR;
a second region of the second conductivity type located within the semiconductor substrate, said second region forming a cathode terminal of the SCR and a first conduction terminal of the embedded variable substrate resistor; and
a third region of the first conductivity type located within the semiconductor substrate and having a higher doping level than the semiconductor substrate, said third region forming a second conduction terminal of the embedded variable substrate resistor.

29. An electrostatic discharge (ESD) protection circuit, comprising:
a first power supply line;
a second power supply line;
a trigger circuit configured to detect an ESD event at one or more of the first and second power supply lines comprising:
a resistive-capacitive ESD detection circuit configured to generate an ESD detection signal in response to said ESD event;
a first inverter circuit having an input coupled to receive the ESD detection signal and an output configured to generate a trigger signal; and
a silicon controlled rectifier (SCR) having an anode terminal connected to the first power supply line and a cathode terminal connected to the second power supply line;
wherein the SCR further includes an embedded field effect transistor (FET) having an insulated gate which forms a control gate terminal coupled to receive said trigger signal.

30. The ESD protection circuit of claim 29, wherein a conduction terminal of the embedded FET forms the cathode terminal of the SCR.

31. The circuit of claim 29, wherein the trigger circuit further comprises:
a second inverter circuit having an input coupled to the output of the first inverter circuit and an output configured to generate a second trigger signal;
wherein the SCR is formed in a semiconductor substrate of a first conductivity type and includes a first region within the semiconductor substrate of the first conductivity type and having a higher doping level than the semiconductor substrate; and
wherein the second trigger signal is applied to the first region.

32. The circuit of claim 31, wherein the semiconductor substrate further includes a second region of a second conductivity type opposite the first conductivity type, said second region forming a conduction terminal of the embedded FET.

33. The circuit of claim 32, wherein the second region further forms the cathode terminal of the SCR.

34. The circuit of claim 29, wherein the SCR is formed in a semiconductor substrate of a first conductivity type and includes a well of a second conductivity type opposite the first conductivity type, said well including a first region of the first conductivity type and having a higher doping level than the semiconductor substrate, said first region forming the anode terminal of the SCR.

35. The circuit of claim 34, wherein the well further includes a second region of the second conductivity type having higher doping level than the well, and wherein the second region is a floating region.

36. The circuit of claim 34, wherein the semiconductor substrate further includes a second region of a second conductivity type opposite the first conductivity type, said second region forming a conduction terminal of the embedded FET.

37. The circuit of claim 36, wherein the second region further forms the cathode terminal of the SCR.

38. An electrostatic discharge (ESD) protection circuit, comprising:
 a first power supply line;
 a second power supply line;
 a trigger circuit configured to detect an ESD event at one or more of the first and second power supply lines comprising:
  a resistive-capacitive ESD detection circuit configured to generate an ESD detection signal in response to said ESD event;
  a first inverter circuit having an input coupled to receive the ESD detection signal and an output configured to generate a trigger signal; and
 a silicon controlled rectifier (SCR) having an anode terminal connected to the first power supply line and a cathode terminal connected to the second power supply line;
 wherein the SCR further includes an embedded variable substrate resistor having an insulated gate which forms a control gate terminal coupled to receive said trigger signal.

39. The ESD protection circuit of claim 38, wherein a conduction terminal of the embedded variable substrate resistor forms the cathode terminal of the SCR.

40. The circuit of claim 38, wherein the trigger circuit further comprises:
 a second inverter circuit having an input coupled to the output of the first inverter circuit and an output configured to generate a second trigger signal;
 wherein the SCR is formed in a semiconductor substrate of a first conductivity type and includes a first region within the semiconductor substrate of the first conductivity type and having a higher doping level than the semiconductor substrate; and
 wherein the second trigger signal is applied to the first region.

41. The circuit of claim 40, wherein the semiconductor substrate further includes a second region of a second conductivity type opposite the first conductivity type, said second region forming a conduction terminal of the embedded variable substrate resistor.

42. The circuit of claim 41, wherein the second region further forms the cathode terminal of the SCR.

43. The circuit of claim 38, wherein the SCR is formed in a semiconductor substrate of a first conductivity type and includes a well of a second conductivity type opposite the first conductivity type, said well including a first region of the first conductivity type and having a higher doping level than the semiconductor substrate, said first region forming the anode terminal of the SCR.

44. The circuit of claim 43, wherein the well further includes a second region of the second conductivity type having higher doping level than the well, and wherein the second region is a floating region.

45. The circuit of claim 43, wherein the semiconductor substrate further includes a second region of a second conductivity type opposite the first conductivity type, said second region forming a conduction terminal of the embedded variable substrate resistor.

46. The circuit of claim 45, wherein the second region further forms the cathode terminal of the SCR.

* * * * *